(12) United States Patent
Cheng

(10) Patent No.: US 8,836,419 B2
(45) Date of Patent: Sep. 16, 2014

(54) PWM COMPARATOR AND CLASS D AMPLIFIER

(75) Inventor: Liang Cheng, Wuxi (CN)

(73) Assignees: CSMC Technologies Fab1 Co., Ltd., Wuxi (CN); CSMC Technologies Fab2 Co., Ltd., Wuxi (CN)

( * ) Notice: Subject to any disclaimer, the term of this patent is extended or adjusted under 35 U.S.C. 154(b) by 89 days.

(21) Appl. No.: 13/807,312

(22) PCT Filed: Dec. 7, 2011

(86) PCT No.: PCT/CN2011/083632
§ 371 (c)(1),
(2), (4) Date: Dec. 28, 2012

(87) PCT Pub. No.: WO2012/079483
PCT Pub. Date: Jun. 21, 2012

(65) Prior Publication Data
US 2013/0093515 A1    Apr. 18, 2013

(30) Foreign Application Priority Data

Dec. 15, 2010  (CN) .......................... 2010 1 0588956

(51) Int. Cl.
*H03F 3/38* (2006.01)
*H03F 3/217* (2006.01)
*H03K 5/24* (2006.01)

(52) U.S. Cl.
CPC .......... *H03F 3/217* (2013.01); *H03F 2200/351* (2013.01); *H03K 5/2481* (2013.01)
USPC ........................................................... 330/10

(58) Field of Classification Search
CPC ............ H03F 3/38; H03F 3/387; H03F 3/393
USPC ............................... 330/10; 332/109; 375/238
See application file for complete search history.

(56) References Cited

U.S. PATENT DOCUMENTS 7,106,130 B2 *   9/2006  Gan et al. ......................... 330/10
2006/0023781 A1 *   2/2006  Leung et al. .................. 375/238

* cited by examiner

*Primary Examiner* — Steven J Mottola
(74) *Attorney, Agent, or Firm* — Anova Law Group, PLLC

(57) ABSTRACT

The present disclosure generally relates to a PWM comparator and a class D amplifier. The PWM comparator described above introduces current feedback mechanism, basing the waveform state of received high frequency triangle signal and the level state of output signal of the PWM comparator, the hysteresis is changing dynamically. In the same resolution, the noise resistance ability of the PWM comparator described above is much better than that of the conventional PWM comparators which has a fixed hysteresis, thus the PWM comparator can work stably even if the duty cycle of output signal is nearly 100%.

14 Claims, 6 Drawing Sheets

--Prior Art--

PWM COMPARATOR AND CLASS D AMPLIFIER

TECHNICAL BACKGROUND

1. Technical Field

The present disclosure relates generally to audio power amplifiers, and more particularly to class D amplifiers.

2. Description of the Related Art

Class D audio power amplifiers are developing rapidly in various applications such as MP3, mobile phone, home theater and so on. They have become the preferred solution in audio systems.

Output power transistors of class D amplifiers work in switch states, their theoretical efficiencies can reach 100%, and their actual efficiencies may be over 90%, compared to actual efficiencies of conventional amplifiers are about 60% or less. The improvement of efficiency may take two advantages: low power consumption and low heat generation. Low heat generation can greatly decrease the size of the heat sink and the area of the PCB of a chip having the class D amplifier. Therefore, the class D amplifier becomes more and more attractive to portable electronics and consumer electronics.

The common modulation principle for a modern class D audio power amplifier is the Pulse Width Modulation (PWM). FIG. 1 is a schematic diagram of a half-bridge class D amplifier incorporating the pulse width modulation. Referring to FIG. 1, the half-bridge class D amplifier includes a pre-operational amplifier, a PWM comparator, a logic circuit, an output power transistor including two MOSFETs, and an external low-pass filter (formed by inductor L and capacitor C) used for restoring amplified audio signal.

The process of the pulse width modulation includes: an audio input signal $V_i$ is amplified by the pre-operational amplifier then to be output as an amplified audio signal $V_{sin}$; the amplified audio signal $V_{sin}$ is modulated to a pulse signal $V_p$ via a high frequency triangle signal $V_{osc}$ of the PWM comparator, the pulse signal $V_p$ is as a PWM signal; the PWM signal $V_p$ passes through the logic circuit and drives the output power transistor to output a switch signal $V_m$; and the switch signal $V_m$ is restored to an audio signal $V_{out}$ by the LC low-pass filter.

An ideal input-output waveform of the PWM comparator is shown in FIG. 2. According to FIG. 2, when $V_{sin}$ is higher than $V_{osc}$, the PWM signal $V_p$ is output at a high level; when $V_{sin}$ is lower than $V_{osc}$, $V_p$ is output at a low level. This modulation mode is generally called "natural sampling", in which a frequency $f_{osc}$ of the high frequency triangle signal $V_{osc}$ is designated as a sampling frequency. In practice, for a balance of efficiency and cost, $f_{osc}$ may be set at about 250 kHz. If $f_{osc}$ is lower than 250 kHz, the efficiency of the class D amplifier may be higher, but a much larger external filter is needed. While $f_{osc}$ is higher than 250 kHz, the situation may be the reverse. The frequency $f_{osc}$ of the high frequency triangle signal $V_{osc}$ is much higher than that of the audio signal $V_{sin}$ (20 Hz~20 kHz), the pulse width (duty cycle) of the PWM signal $V_p$ in each cycle time of the triangle signal is directly proportional to the amplitude of the amplified audio signal $V_{sin}$, which means an audio signal is transformed to pulse signals with different pulse widths.

According to the above description, the PWM comparator is a crucial module in the generation of the PWM signal. According to practical dealt with audio signals, PWM comparators shall have: (1) large bandwidths for achieving high conversion speed; (2) high-gains for achieving high-precision; (3) great noise resistance abilities to ensure that the PWM signal $V_p$ can flip correctly in noisy environment.

According to FIG. 2, in a correct modulation process, the PWM signal $V_p$ can only flip from high level to low level on a rising edge of the triangle signal, while the PWM signal $V_p$ can only flip from low level to high level on a falling edge of the triangle signal.

According to FIG. 3, a conventional PWM comparator includes: a pre-amplify circuit, a judge circuit, and an output s circuit. Referring to the judge circuit, a gate of an NMOSFET M6 is connected with a drain of an NMOSFET M7, a gate of the NMOSFET M7 is connected with a drain of the NMOSFET M6, such that a positive feedback is obtained, and the gain of the judge circuit is increased. Further, the connection may achieve to suppress noises by producing a hysteresis. Given that a transconductance gm1 of an NMOSFET M1 for receiving $V_{sin}$ and a transconductance gm2 of an NMOSFET M2 for receiving $V_{osc}$ are respectively equal to gm, a width to length ratio $(W/L)_{6,7}$ of the NMOSFETs M6 and M7 is $\beta_B$, a width to length ratio of NMOSFETs M5 to M8 $(W/L)_{5,8}$ is $\beta_A$, and $\beta_B \geq \beta_A$. In steady states, NMOSFETs M6 and M7 work only in cutoff region or linear region. Given that a drain current $I_{D3}$ of a PMOSFET M3 is equal to $I_{ss}$, and a drain current $I_{D4}$ of a PMOSFET M4 is equal to 0, NMOSFETs M5 and M7 would be active, and NMOSFETs M6 and M8 would be cutoff. With a gradual increase of $I_{D4}$, $I_{D3}$ would gradually decrease, and an electric potential of the NMOSFET M7 would increase until the NMOSFET M7 goes into saturation region. At the point that equation (1) below is established:

$$I_{D4} = \frac{\beta_B}{2}(V_A - V_{THN})^2 = \frac{\beta_B}{\beta_A} I_{D3} \qquad (1)$$

the threshold point of the current $I_{D4}$ would be the boundary that the PWM signal $V_p$ flips from high level to low level. After the NMOSFET M7 goes into the saturation region, the NMOSFETs M5 and M7 are cutoff, the NMOSFETs M6 and M8 are active. Similarly, under the situation that $I_{D3}$ increases and $I_{D4}$ decreases, at the boundary that the equation (2) below is established, the PWM signal $V_p$ would flip from low level to high level:

$$I_{D3} = \frac{\beta_B}{\beta_A} I_{D4} \qquad (2)$$

According to equation (1) and equation (3) below:

$$I_{D3} = \frac{g_m}{2}(V_{sin} - V_{osc}) + \frac{I_{ss}}{2} = I_{ss} - I_{D4} \qquad (3)$$

it could be concluded that:

$$V_{SPH} = V_{sin} - V_{osc} = \frac{I_{ss}}{g_m} \frac{\beta_A - \beta_B}{\beta_A + \beta_B} = -V_{SPL} \qquad (4)$$

wherein $V_{SPH}$ is the flipping upper limit of the PWM comparator (flipping from low level to high level), $V_{SPL}$ is the flipping lower limit of the PWM comparator (flipping from high level to low level).

Referring to FIG. 4, a hysteresis transfer characteristic curve of the PWM signal $V_p$ is shown. The abscissa thereof stands for the value of the difference of $V_{sin}$ minus $V_{osc}$, the ordinate thereof expresses the value of $V_p$. The changes of the PWM signal $V_p$ are:

when $V_{sin}-V_{osc}>V_{SPH}$, $V_p=GND \rightarrow V_{CC}$; when $V_{sin}-V_{osc}<V_{SPL}$, $V_p=V_{CC} \rightarrow GND$ (5)

$V_H=V_{SPH}-V_{SPL}$ (6)

However, conventional PWM comparators have these disadvantages:

1) According to equations (4) and (5), once the size of the devices (width to length ratio) is determined, the flipping upper limit $V_{SPH}$ and the flipping lower limit $V_{SPL}$ are fixed, which means the hysteresis section $V_H$ is fixed. When PWM are used in audio applications, fixed $V_H$ would have disadvantages. When the amplitude of $V_{osc}$ approaches to $V_{sin}$, due to the existence of noises, $V_p$ is prone to flip incorrectly if the $V_H$ is set too small. It means that a big noise can make $V_p$ to flip from low level to high level on rising edge of the triangle signal.

2) On the falling edge of the triangle signal $V_{osc}$, $V_p$ may flip from high level to low level by mistake. This mistake may happen in the case that the duty cycle of a switch signal is nearly 100%. In that time the triangle signal is in the process of changing from the falling edge to the rising edge. Normally, the triangle signal is obtained through charging and discharging of a capacitor, which would be easy to generate a relatively large noise. If the hysteresis section $V_H$ is determined to be too large, the resolution of the PWM comparator will decrease significantly, which would cause a relatively large distortion.

SUMMARY

The present disclosure provides a PWM comparator and a class D amplifier in order to enhance the noise resistance ability of devices.

In order to solve the problem described above, the present disclosure provides a PWM comparator including a pre-amplified circuit, a feedback circuit and a judge circuit. The pre-amplified circuit includes two input-terminals respectively for receiving a high frequency triangle signal and an input audio signal, and the pre-amplified circuit outputs the changes of waveform of the high frequency triangle signal and the input audio signal to the feedback circuit and the judge circuit. The feedback circuit is connected to the pre-amplified circuit and the judge circuit, the feedback circuit comprises an internal current source, the feedback circuit adjusts the current from the current source to the input of the judge circuit, according to the waveform changes of the high frequency triangle signal received from the pre-amplified circuit, and a voltage level of PWM signals of the PWM comparator. The judge circuit is connected to the feedback circuit, the judge circuit obtains the changes of the high frequency triangle signal and the input audio signal based on a change of a input current of the judge circuit, and generates a comparison result according to a comparison of the high frequency triangle signal and the input audio signal.

The present disclosure further provides a class D amplifier including the PWM comparator described above.

The PWM comparator and class D described above have these advantages: the PWM comparator introduces current feedback principle, based on the waveform state of receiving high frequency triangle signal and the level state of output signal of the PWM comparator, the hysteresis changes dynamically. With the same resolution, the noise resistance ability of the PWM comparator described above is much better than that of the conventional PWM comparators which has a fixed hysteresis, thus the PWM comparator can work stably even if the duty cycle of output signal is nearly 100%.

DETAILED DESCRIPTION

The detailed description of the present disclosure will be discussed in the following embodiments, which are not intended to limit the scope of the present disclosure, but still can be adapted for other applications. While drawings are illustrated in details, it is appreciated that the quantity of the disclosed components could be greater or less than that disclosed, except those components with expressly restricted amount.

According to the current disclosure, a current feedback principle can be introduced into the conventional fixed hysteresis-section PWM comparator. The waveform state (on rising edge or falling edge) of the high frequency triangle signal $V_{osc}$ and the level state (high level or low level) of the PWM signal $V_p$ can be reflected by the current feedback. Further, the hysteresis can be determined basing the state of the high frequency triangle signal $V_{osc}$ and the PWM signal $V_p$.

Figure 5:
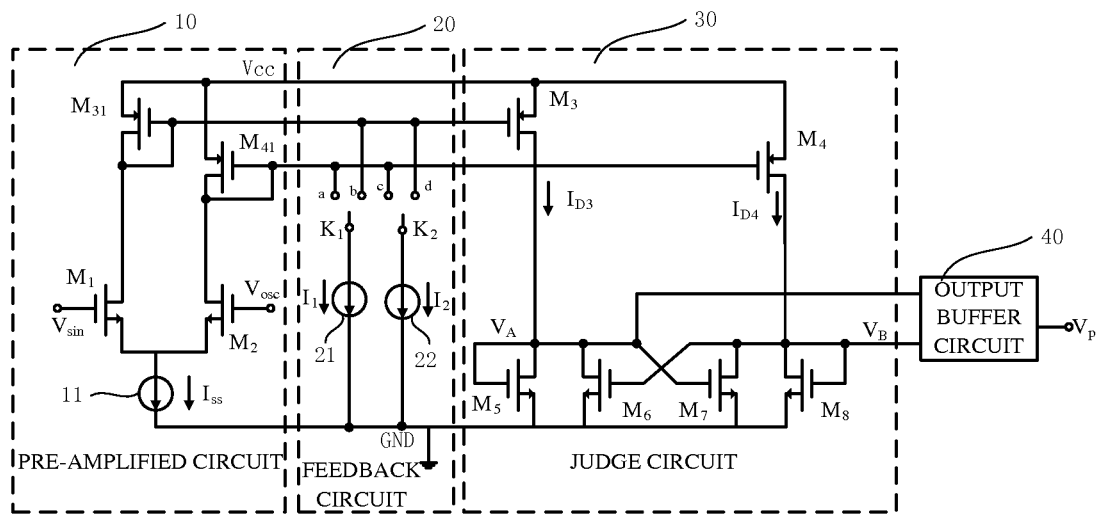
FIG. 5 is a circuit diagram of a PWM comparator in accordance with an embodiment of the present disclosure.

According to FIG. 5, a PWM comparator in accordance with an exemplary embodiment of the present disclosure is shown. The PWM comparator includes a pre-amplified circuit 10, a feedback circuit 20, a judge circuit 30 and an output buffer circuit 40. The pre-amplified circuit 10 has two input-terminals, one for receiving a high frequency triangle signal $V_{osc}$, the other for receiving an input audio signal $V_{sin}$. The buffer circuit 40 outputs a PWM signal $V_p$ according to a comparison between the high frequency triangle signal $V_{osc}$ and the input audio signal $V_{sin}$.

The pre-amplified circuit 10 includes: a first input NMOSFET $M_1$, a second input NMOSFET $M_2$, a first mirror PMOSFET $M_{31}$, and a second mirror PMOSFET $M_{41}$. A gate of the first input NMOSFET $M_1$ is coupled to receive the input audio signal $V_{sin}$, drains of the first input NMOSFET $M_1$ and the first mirror PMOSFET $M_{31}$ are connected together, and sources of the first input NMOSFET $M_1$ and the second input NMOSFET $M_2$ are connected together. A gate of the second input NMOSFET $M_2$ is coupled to receive the high frequency triangle signal $V_{osc}$, drains of the second input NMOSFET $M_2$ and the second mirror PMOSFET $M_{41}$ are connected together. A first current source 11 is coupled between a ground GND and sources of the first input NMOSFET M$_1$ and the second input NMOSFET M$_2$. The current source 11 provides an output current I$_{ss}$. A gate and a drain of the first mirror PMOSFET M$_{31}$ are connected directly; and a source of the first mirror PMOSFET M$_{31}$ is connected with a power source V$_{cc}$. A gate and a drain of the second mirror PMOSFET M$_{41}$ are connected directly, and a source of the second mirror PMOSFET M$_{41}$ is connected with the power source V$_{cc}$.

The feedback circuit 20 includes a second current source 21, a third current source 22, a first switch K$_1$, and a second switch K$_2$. The second current source 21 provides an output current I$_1$, the third current source 22 provides an output current I$_2$, provided that I$_1$ and I$_2$ both equal to I. One terminal of the first switch K$_1$ is connected with the second current source 21. According to the waveform state of the high frequency triangle signal V$_{osc}$, the other terminal of the first switch K$_1$ is able to be connected with a first contact terminal a coupling to the gate of the second mirror PMOSFET M$_{41}$, or a second contact terminal b connecting with the gate of the first mirror PMOSFET M$_{31}$. One terminal of the second switch K$_2$ is connected with the third current source 22. According to the level state of the PWM signal V$_p$, the other terminal of the second switch K$_2$ is able to be connected with a third contact terminal c coupling to the gate of the second mirror PMOSFET M$_{41}$, or a fourth contact terminal d connected with the gate of the first mirror PMOSFET M$_{31}$. The first switch K$_1$ and the second switch K$_2$ are controlled as follows: when the high frequency triangle signal V$_{osc}$ is on its rising edge, the first switch K$_1$ is connected to the first contact terminal a; when the high frequency triangle signal V$_{osc}$ is on its falling edge, the first switch K$_1$ is connected to the second contact terminal b; when the PWM signal V$_p$ is low level, the second switch K$_2$ is connected with the third contact terminal c; when the PWM signal V$_p$ is high level, the second switch K$_2$ is connected with the fourth contact terminal d.

The judge circuit 30 includes a third mirror PMOSFET M$_3$, a fourth mirror PMOSFET M$_4$, a first comparing NMOSFET M$_5$, a second comparing NMOSFET M$_6$, a third comparing NMOSFET M$_7$, and a fourth comparing NMOSFET M$_8$. The source of the third mirror PMOSFET M$_3$ is connected with the power source V$_{cc}$, gates of the third mirror PMOSFET M$_3$ and the first mirror PMOSFET M$_{31}$ are connected together, drains of the third mirror PMOSFET M$_3$ and the first comparing NMOSFET M$_5$ are connected together. The third mirror PMOSFET M$_3$ and the first mirror PMOSFET M$_{31}$ cooperatively constitutes a mirror current source. A source of the fourth mirror PMOSFET M$_4$ is connected with the power source V$_{cc}$, gates of the fourth mirror PMOSFET M$_4$ and the second mirror PMOSFET M$_{41}$ are connected together, drains of the fourth mirror PMOSFET M$_4$ and the fourth comparing NMOSFET M$_8$ are connected together. The fourth mirror PMOSFET M$_4$ and the second mirror PMOSFET M$_{41}$ cooperatively constitutes a mirror current source. The gate and the drain of the first comparing NMOSFET M$_5$ are interconnected; the source of the first comparing NMOSFET M$_5$ is grounded. The gate of the second comparing NMOSFET M$_6$ connects to the drain of the third comparing NMOSFET M$_7$, the drain of the second comparing NMOSFET M$_6$ connects the gate of the third comparing NMOSFET M$_7$, and sources of the second comparing NMOSFET M$_6$ and the third comparing NMOSFET M$_7$ are grounded. The gate of the third comparing NMOSFET M$_7$ is connected with the drain of the third mirror PMOSFET M$_3$; the drains of the third comparing NMOSFET M$_7$ and the fourth mirror PMOSFET M$_4$ are connected together. The gate and the drain of the fourth comparing NMOSFET M$_8$ are interconnected; the source of the fourth comparing NMOSFET M$_8$ connects to ground.

The output buffer circuit 40 has two input terminals connected to the gate and the drain of the third comparing NMOSFET M$_7$, respectively, and one output terminal is for outputting the PWM signal V$_p$.

The analysis for the PWM comparator shown in FIG. 5 is as follows:

Hysteresis of the PWM comparator described above will change by the states of the switches K$_1$ and K$_2$, therefore the PWM comparator is a dynamic hysteresis comparator.

In the feedback circuit, regardless of the states of the switches K$_1$ and K$_2$, the equation (7) as below establishes:

$$I_{D3}+I_{D4}=2I+I_{SS} \tag{7}$$

Designating the width to length ratio (W/L)$_{6,7}$ of the second comparing NMOSFET M$_6$ and the third comparing NMOSFET M$_7$ equals to $\beta_C$, width to length ratio (W/L)$_{5,8}$ of the first comparing NMOSFET M$_5$ and the fourth comparing NMOSFET M$_8$ equals to $\beta_A$. Incorporating the high frequency triangle signal V$_{osc}$ and the PWM signal V$_p$, comprehensively analyze the hysteresis situation of dynamic hysteresis comparator in various switch statuses as follows:

1) When the high frequency triangle signal V$_{osc}$ is on its rising edge and the PWM signal V$_p$ is at a high level, the switch K$_1$ is connected with the first contact terminal a, the switch K$_2$ is connected with the second contact terminal d, and the below equation (8) establishes:

$$I_{D3} = \frac{g_m}{2}(V_{sin} - V_{osc}) + \frac{I_{SS}}{2} + I \tag{8}$$

In this state, the PWM signal V$_p$ can only flip from the high level to the low level, such that only a flipping lower limit V$_{SPL0}$ should be considered. Referring to the analysis of the fixed hysteresis comparator described above, according to equations (1), (2), (7) and (8), and change $\beta_B$ to $\beta_C$, there is equation (9) establishes:

$$V_{SPL0} = \frac{I_{SS} + 2I}{g_m} \frac{\beta_C - \beta_A}{\beta_C + \beta_A} \tag{9}$$

2) When the high frequency triangle signal V$_{osc}$ is on its rising edge and the PWM signal V$_p$ is at a low level, the switch K$_1$ is connected with the first contact terminal a, and the switch K$_2$ is connected with the third contact terminal c, and equation (10) as below establishes:

$$I_{D3} = \frac{g_m}{2}(V_{sin} - V_{osc}) + \frac{I_{SS}}{2} \tag{10}$$

In this state, the PWM signal V$_p$ can only flip from low level to high level, such that only a flipping higher limit V$_{SPH1}$ should be considered, there is equation (11) as below establishes:

$$V_{SPH1} = \frac{I_{SS} + 2I}{g_m} \frac{\beta_A - \beta_C}{\beta_C + \beta_A} + \frac{2I}{g_m} \tag{11}$$

3) When the high frequency triangle signal V$_{osc}$ is on the falling edge and the PWM signal V$_p$ is at a low level, the switch $K_1$ is connected with the second contact terminal b, the switch $K_2$ is connected with the third contact terminal c, and the below equation (12) establishes:

$$I_{D3} = \frac{g_m}{2}(V_{sin} - V_{osc}) + \frac{I_{ss}}{2} + I \quad (12)$$

In this state, the PWM signal $V_p$ can only flip from low level to high level, such that only a flipping higher limit $V_{SPH0}$ should be considered, there is the below equation (13) establishes:

$$V_{SPH0} = \frac{I_{SS} + 2I}{g_m} \frac{\beta_A - \beta_C}{\beta_C + \beta_A} = -V_{SPL0} \quad (13)$$

4) When the high frequency triangle signal $V_{osc}$ is on the falling edge and the PWM signal $V_p$ is at a high level, the switch $K_1$ is connected with the second contact terminal b, the switch $K_2$ is connected with the fourth contact terminal d, and the below equation (14) establishes:

$$I_{D3} = \frac{g_m}{2}(V_{sin} - V_{osc}) + \frac{I_{ss}}{2} + 2I \quad (14)$$

In this state, the PWM signal $V_p$ can only flip from high level to low level, such that only a flipping lower limit $V_{SPL1}$ should be considered, expressed as the equation (15) below:

$$V_{SPL1} = \frac{I_{SS} + 2I}{g_m} \frac{\beta_C - \beta_A}{\beta_C + \beta_A} - \frac{2I}{g_m} = -V_{SPH1} \quad (15)$$

Figure 1:
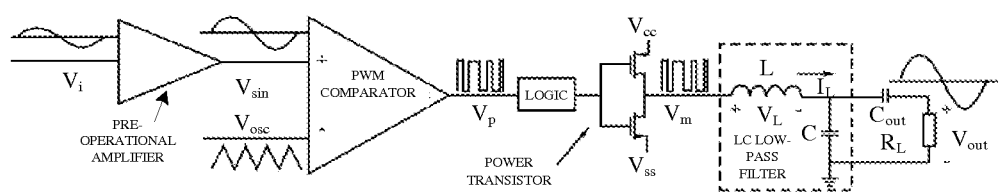
FIG. 1 is a schematic diagram of a half-bridge class D amplifier based on the pulse width modulation.
Figure 2:
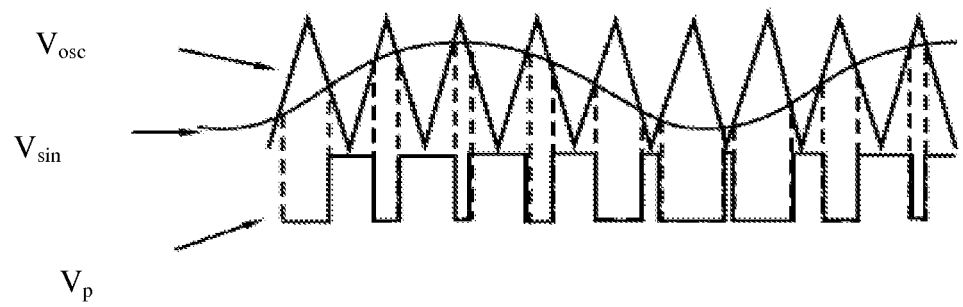
FIG. 2 shows an ideal waveform of a PWM.
Figure 3:
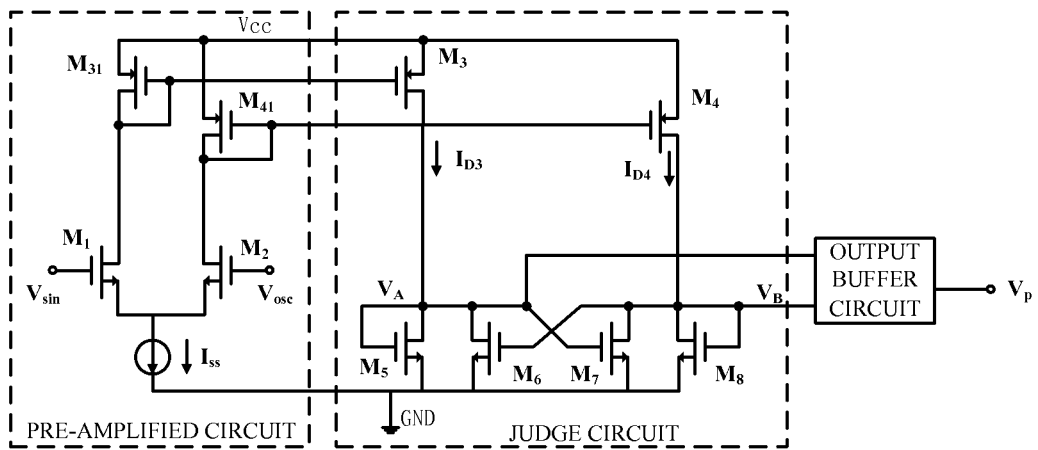
FIG. 3 is a circuit diagram of a conventional PWM comparator.
Figure 4:
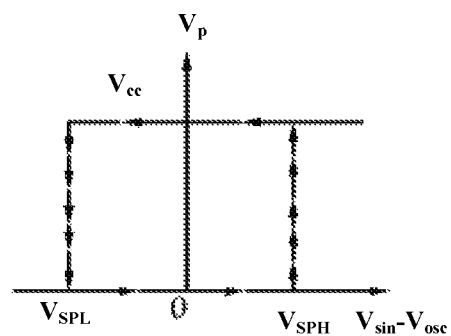
FIG. 4 shows a state transfer characteristic curve of the PWM comparator shown in FIG. 3.
Figure 6:
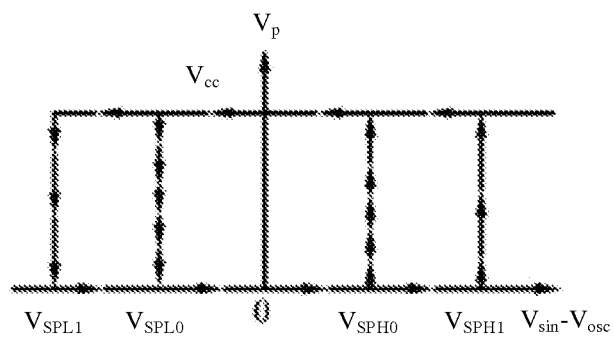
FIG. 6 shows a state transfer characteristic curve of the PWM comparator showed shown in FIG. 5.

FIG. 6 shows a state transfer characteristic curve of the PWM comparator as shown in FIG. 5. In FIG. 6, the abscissa stands for the difference of $V_{sin}$ minus $V_{osc}$, the ordinate stands for the value of $V_p$. Referring together to FIG. 5 and FIG. 6, give equations that $V_{H0}=V_{SPH0}-V_{SPL0}$, and $V_{H1}=V_{SPH1}-V_{SPL1}$. According to the above description, in the correct processes of pulse width modulation, the PWM signal $V_p$ can only flip in state 1) and 3), so it is incorrect if the PWM signal $V_p$ flips in state 2) and 4). Therefore, it can be clear that $V_{H0}$ affects the resolution of the PWM comparator, and $V_{H1}$ determines the noise resistance ability range of the PWM comparator. Adjusting $\beta_C$ to make it equal to $\beta_B$, for making $V_{H0}$ being equal to $V_H$ further for ensuring the resolution of the PWM comparator as shown in FIG. 5 to be the same as the resolution of the PWM comparator as shown in FIG. 3. According to equations (9), (11), (13), and (15), the below equation (16) establishes:

$$V_{H1} = V_{H0} + \frac{4I}{g_m} = V_H + \frac{4I}{g_m} \quad (16)$$

According to the above description, in the dynamic hysteresis comparator, the hysteresis value which affects the resolution (accuracy) is different from the hysteresis value which affects the noise resistance ability range of the PWM comparator. In the current embodiment, the resolution and the noise resistance ability range are separated to be independent features. According to equation (16), if the resolutions are identical, the PWM comparator as shown in FIG. 5 has a larger noise resistance ability range than that of the conventional fixed hysteresis comparator.

Figure 7:
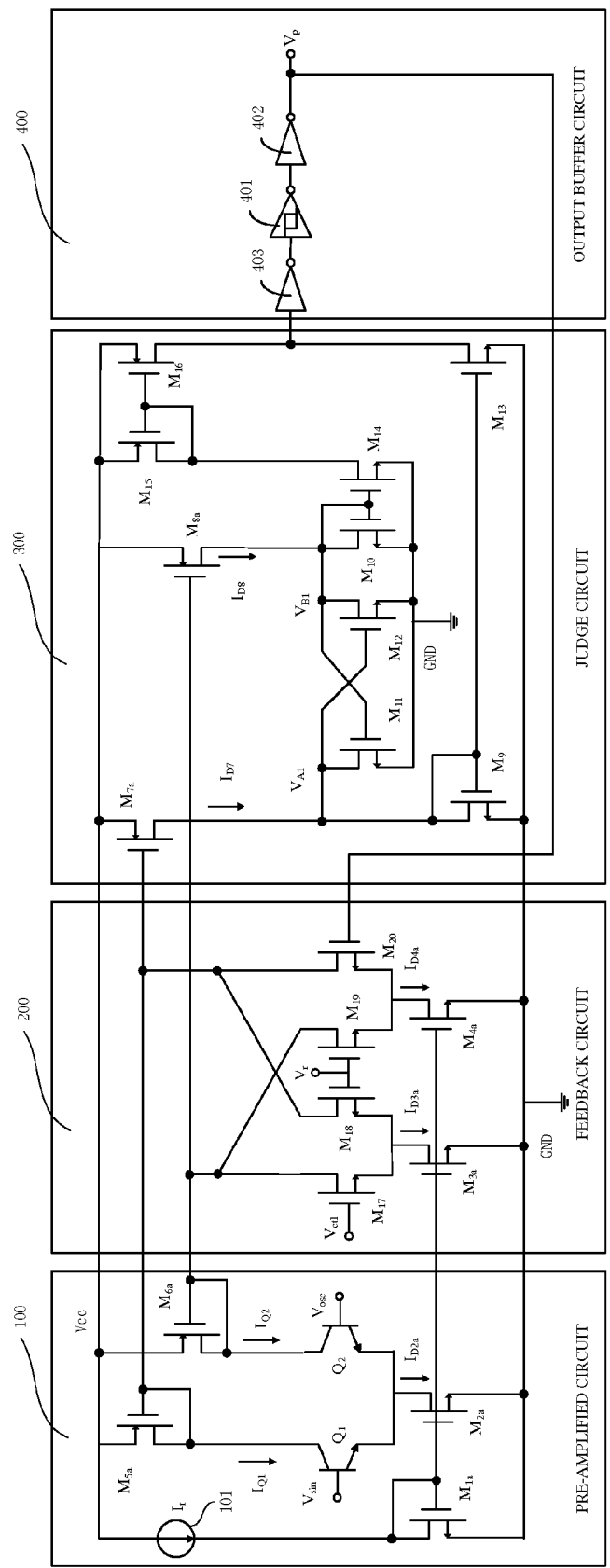
FIG. 7 is a circuit diagram of a PWM comparator in accordance with another embodiment of the present disclosure.

According to FIG. 7, another exemplary embodiment of the PWM comparator of the present disclosure includes a pre-amplified circuit 100, a feedback circuit 200, a judge circuit 300, and an output buffer circuit 400. The pre-amplified circuit 100 has two input-terminals, one is for receiving a high frequency triangle signal $V_{osc}$, and the other is for receiving an input audio signal $V_{sin}$. The buffer circuit 400 outputs a PWM signal $V_p$ according to a comparison between the high frequency triangle signal $V_{osc}$ and the input audio signal $V_{sin}$.

The pre-amplified circuit 100 includes: a first input NPN transistor $Q_1$, a second input NPN transistor $Q_2$, a first mirror PMOSFET $M_{5a}$, a second mirror PMOSFET $M_{6a}$, a first mirror NMOSFET $M_{1a}$, and a second mirror NMOSFET $M_{2a}$. The base of the first input NPN transistor $Q_1$ is used for receiving the input audio signal $V_{sin}$, the collector of the first input NPN transistor $Q_1$ connects with the drain of the first mirror PMOSFET $M_{5a}$, emitters of the first input NPN transistor $Q_1$ and the second input NPN transistor $Q_2$ are connected together. The base of the second input NPN transistor $Q_2$ is used for receiving a high frequency triangle signal $V_{osc}$, the collector of the second input NPN transistor $Q_2$ is connected with the drain of the second mirror PMOSFET $M_{6a}$. The first mirror NMOSFET $M_{1a}$ and the second mirror NMOSFET $M_{2a}$ cooperatively constitutes a mirror current source, the drain of the first mirror NMOSFET $M_{1a}$ is connected with one terminal of a current source 101. Both the emitters of the first input NPN transistor $Q_1$ and the second input NPN transistor $Q_2$ are connected with the drain of the second mirror NMOSFET $M_{2a}$. Sources of the first mirror NMOSFET $M_{1a}$ and the second mirror NMOSFET $M_{2a}$ are grounded.

The other terminal of the current source 101 is connected with a power source $V_{cc}$, the current source 101 provides a reference current $I_r$. The gate and the drain of the first mirror PMOSFET $M_{5a}$ is interconnected. The source of the first mirror PMOSFET $M_{5a}$ is connected with the power source $V_{cc}$. The gate and the drain of the second mirror PMOSFET $M_{6a}$ are interconnected, the source of the second mirror PMOSFET $M_{6a}$ is connected with the power source $V_{cc}$.

The feedback circuit 200 includes a first feedback NMOSFET $M_{17}$, a second feedback NMOSFET $M_{18}$, a third feedback NMOSFET $M_{19}$, a fourth feedback NMOSFET $M_{20}$, a third mirror NMOSFET $M_{3a}$, and a fourth mirror NMOSFET $M_{4a}$. The gate of the first feedback NMOSFET $M_{17}$ is used for receiving an external control signal $V_{ctl}$, the drain of the first feedback NMOSFET $M_{17}$ is connected with the gate of the second mirror PMOSFET $M_{6a}$. Both the sources of the first feedback NMOSFET $M_{17}$ and the second feedback NMOSFET $M_{18}$ are connected with the drain of the third mirror NMOSFET $M_{3a}$. The gate of the second feedback NMOSFET $M_{18}$ is used for receiving a reference voltage $V_r$, and the drain of the second feedback NMOSFET $M_{18}$ is connected with the gate of first mirror PMOSFET $M_{5a}$. The gate of the third feedback NMOSFET $M_{19}$ is used for receiving the reference voltage $V_r$, the drain of the third feedback NMOSFET $M_{19}$ is connected with the gate of the second mirror PMOSFET $M_{6a}$, and the source of the third feedback NMOSFET $M_{19}$ is connected with both the source of the fourth feedback NMOSFET $M_{20}$ and the drain of the fourth mirror NMOSFET $M_{4a}$. The gate of the fourth feedback NMOSFET $M_{20}$ is connected with the output-terminal of the output buffer circuit 400 in order to receive the PWM signal $V_p$, and the drain of the fourth feedback NMOSFET $M_{20}$ is connected with the gate of the first mirror PMOSFET $M_{5a}$. The third mirror NMOSFET $M_{3a}$ and the first mirror NMOSFET $M_{1a}$ cooperatively constitutes a mirror current source. The fourth mirror NMOSFET $M_{4a}$ and the first mirror NMOSFET $M_{1a}$ cooperatively constitutes a mirror current source. The sources of the third mirror NMOSFET $M_{3a}$ and the fourth mirror NMOSFET $M_{4a}$ are connected to ground.

The judge circuit 300 includes a third mirror PMOSFET $M_{7a}$, a fourth mirror PMOSFET $M_{8a}$, a first comparing NMOSFET $M_9$, a second comparing NMOSFET $M_{10}$, a third comparing NMOSFET $M_{11}$, a fourth comparing NMOSFET $M_{12}$, a fifth mirror NMOSFET $M_{13}$, a sixth mirror NMOSFET $M_{14}$, a fifth mirror PMOSFET $M_{15}$, and a sixth mirror PMOSFET $M_{16}$. The source of the third mirror PMOSFET $M_{7a}$ is connected with the power source $V_{cc}$, the gate of the third mirror PMOSFET $M_{7a}$ is connected with the gate of the first mirror PMOSFET $M_{5a}$, and the drains of the third mirror PMOSFET $M_{7a}$ and the first comparing NMOSFET $M_9$ are connected together. The third mirror PMOSFET $M_{7a}$ and the first mirror PMOSFET $M_{5a}$ cooperatively constitutes a mirror current source. The source of the fourth mirror PMOSFET $M_{8a}$ is connected with the power source $V_{cc}$, the gates of the fourth mirror PMOSFET $M_{8a}$ and the second mirror PMOSFET $M_{6a}$ are connected together, and the drains of the fourth mirror PMOSFET $M_{8a}$ and the second comparing NMOSFET $M_{10}$ are connected together. The fourth mirror PMOSFET $M_{8a}$ and the second mirror PMOSFET $M_{6a}$ cooperatively constitutes a mirror current source. The gate and the drain of the first comparing NMOSFET $M_9$ are interconnected; the source of the first comparing NMOSFET $M_9$ connects to ground. The sources of the third comparing NMOSFET $M_{11}$ and the fourth comparing NMOSFET $M_{12}$ are connected to ground; the gate of the third comparing NMOSFET $M_{11}$ connects with the drain of the fourth comparing NMOSFET $M_{12}$, and the gate of the fourth comparing NMOSFET $M_{12}$ connects with the drain of the third comparing NMOSFET $M_{11}$. The gate of the fourth comparing NMOSFET $M_{12}$ is connected with the drain of the third mirror PMOSFET $M_{7a}$, and the drains of the fourth comparing NMOSFET $M_{12}$ and the fourth mirror PMOSFET $M_{8a}$ are connected together. The gate and the drain of the second comparing NMOSFET $M_{10}$ are interconnected, and the source of the second comparing NMOSFET $M_{10}$ connects to ground. The fifth mirror NMOSFET $M_{13}$ and the first comparing NMOSFET $M_9$ cooperatively constitutes a mirror current source, the source of the fifth mirror NMOSFET $M_{13}$ connects to ground, and the drains of the fifth mirror NMOSFET $M_{13}$ and the sixth mirror PMOSFET $M_{16}$ are connected together. The sixth mirror NMOSFET $M_{14}$ and the second comparing NMOSFET $M_{10}$ cooperatively constitutes a mirror current source, the source of the sixth mirror NMOSFET $M_{14}$ connects to ground, and the drains of the sixth mirror NMOSFET $M_{14}$ and the fifth mirror PMOSFET $M_{15}$ are connected together. The fifth mirror PMOSFET $M_{15}$ and the sixth mirror PMOSFET $M_{16}$ cooperatively constitutes a mirror current source, and the sources of the fifth mirror PMOSFET $M_{15}$ and the sixth mirror PMOSFET $M_{16}$ connect with power source $V_{cc}$.

The output buffer circuit 400 includes: a first inverter 403, a Schmitt trigger 401, and a second inverter 402 that are connected in series. The input-terminal of the first inverter 403 is connected with the drain of the sixth mirror PMOSFET $M_{16}$, and the second inverter 402 is coupled for inputting the PWM signal $V_p$.

The PWM comparator showed in FIG. 7 is described as follows:

In the pre-amplified circuit 100, the first input NPN transistor $Q_1$ and the second input NPN transistor have a lower imbalance voltage and a higher gain comparing with the MOS devices which have the same layout area.

The pre-amplified circuit 100 and the judge circuit 300 have a CMOS operational transconductance amplifier (OTA) structure, the interconnection node are all low-resistance nodes except for the drains of the sixth mirror PMOSFET $M_{16}$ and the fifth mirror NMOSFET $M_{13}$, thus implementing a large bandwidth.

The output buffer circuit 400, formed by two inverters and a Schmitt trigger, functions as follows: (1) shaping the output signal of the judge circuit 300 to reduce the conversion time of the output pulse signal (flipping from high to low or from low to high); (2) increasing driving capability; (3) isolating external load; (4) the Schmitt trigger has a relatively good noise resistance ability.

The fourth feedback NMOSFETs $M_{17}$~$M_{20}$ in the feedback circuit 200 function similar to the first switch $K_1$ and the second switch $K_2$, and the waveform state of the external control signal $V_{ctl}$ corresponds with that of the high frequency triangle signal $V_{osc}$. While the high frequency triangle signal $V_{osc}$ is in rising edge, the external control signal $V_{ctl}$ is high level; while the high frequency triangle signal $V_{as}$ is on the falling edge, the external control signal $V_{ctl}$ is low level.

In order to verify the performance of the PWM comparator as shown in FIG. 7, the size of the devices are designed as follows: the width to length ratios of the first mirror NMOSFET $M_{1a}$, the third mirror NMOSFET $M_{1a}$, and the fourth mirror NMOSFET $M_{4a}$ are identical; the width to length ratio of the second mirror NMOSFET $M_{2a}$ is four times as that of the first mirror NMOSFET $M_{1a}$; the width to length ratios of the first mirror PMOSFET $M_{5a}$, the second mirror PMOSFET $M_{6a}$, the third mirror PMOSFET $M_{7a}$, and the fourth mirror PMOSFET $M_{8a}$ are identical, which are greater than that of the second mirror NMOSFET $M_{2a}$; the width to length ratios of the first comparing NMOSFET $M_9$, the second comparing NMOSFET $M_{10}$, the fifth mirror NMOSFET $M_{13}$, and the sixth mirror NMOSFET $M_{14}$ are identical, which are greater than that of the first mirror NMOSFET $M_{1a}$ and less than that of the second mirror NMOSFET $M_{2a}$; the width to length ratios of the third comparing NMOSFET $M_{11}$ and the fourth comparing NMOSFET $M_{12}$ are identical, which are greater than that of the first comparing NMOSFET $M_9$ and less than that of the second mirror NMOSFET $M_{2a}$; the width to length ratios of the fifth mirror PMOSFET $M_{15}$ and the sixth mirror PMOSFET $M_{16}$ are identical, which are greater than that of the first mirror PMOSFET $M_{5a}$; the width to length ratios of the first feedback NMOSFET $M_{17}$ to the fourth feedback NMOSFET $M_{20}$ are identical, which are less than that of the first mirror NMOSFET $M_{1a}$. And further, a suitable reference current and reference voltage is set.

Figure 8:
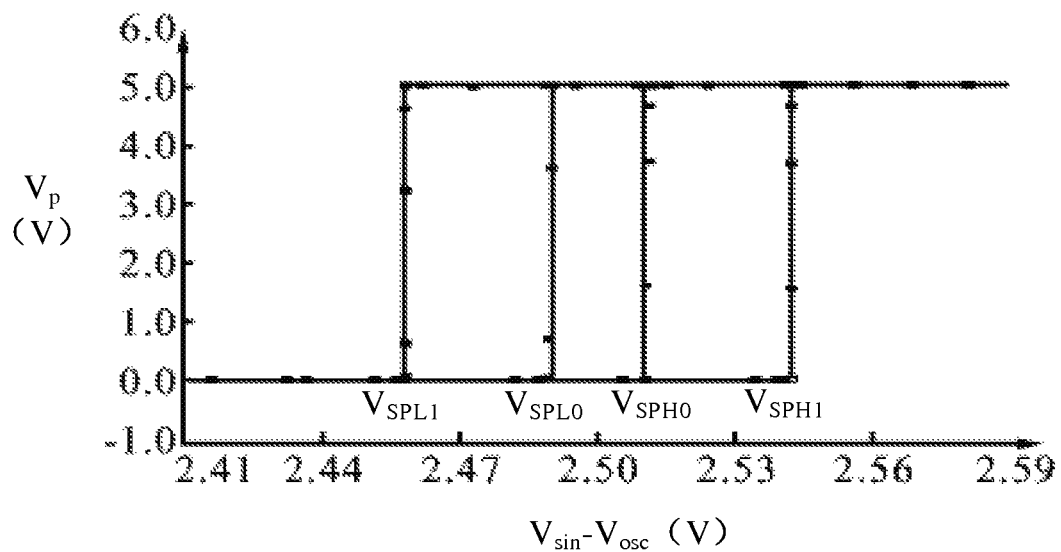
FIG. 8 shows a simulation waveform of state transfer characteristic of the PWM comparator shown in FIG. 7.

Basing the size design and the reference current and reference voltage settings described above, FIG. 8 shows a simulation waveform of state transfer characteristic of the PMW comparator simulated in Spectre. The input in the $V_{osc}$ terminal is a 1~4V triangle signal, and the input in the $V_{sin}$ terminal is an analog audio signal. According to FIG. 8, when the PWM comparator is in state 1) or state 3), $V_{SPH0}$ is about 2.51V and $V_{SPL0}$ is about 2.49V, and therefore $V_{H0}$ equals about 20 mV; when the PWM comparator is in state 2) or state 4) (incorrect flipping), $V_{SPH1}$ is about 2.54V and $V_{SPL1}$ is about 2.46V, therefore $V_{H1}$ equals about 80 mV. It can be seen that, with identical resolutions ($V_{H0}$ equals $V_H$), compared with the PWM comparator as shown in FIG. 3, the comparator as shown in FIG. 7 has a larger 60 mV noise resistance ability range, therefore the capability of the PWM comparator has been enhanced greatly.

Figure 9:
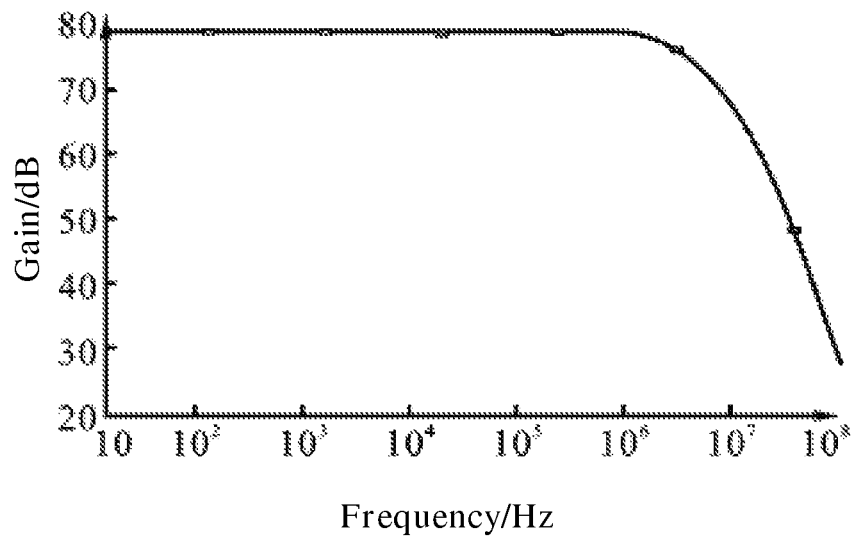
FIG. 9 shows a simulation waveform of alternating gain of the PWM comparator shown in FIG. 7.

FIG. 9 shows a simulation waveform of the alternating gain of the PWM comparator as shown in FIG. 7. According to FIG. 9, the gain of the PWM comparator attains to 79 dB, the 3 dB bandwidth is larger than 1 MHz, and the unity gain bandwidth is larger than 10 MHz, which can meet the design requirements of high-speed and high-precision.

Figure 10:
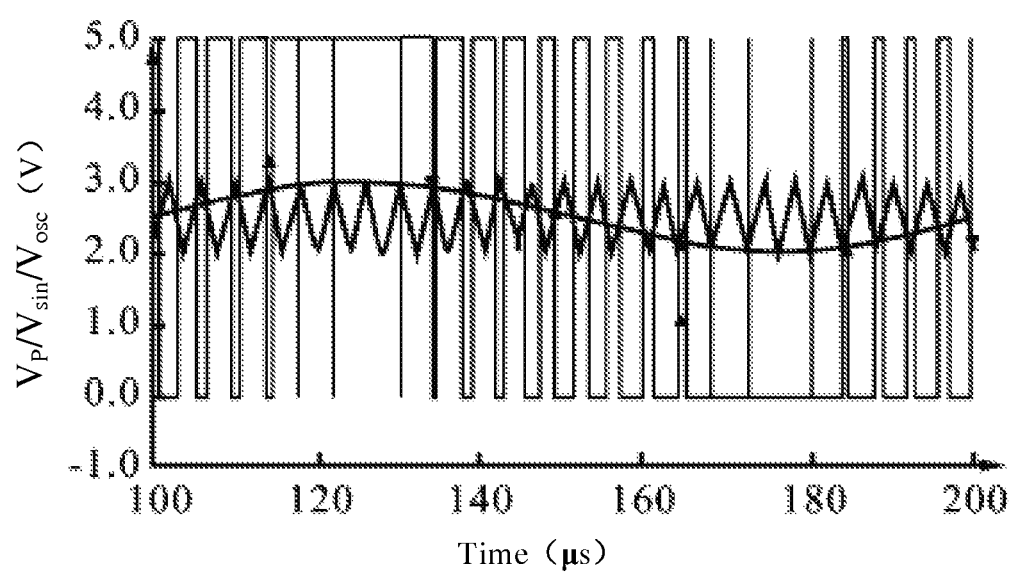
FIG. 10 shows a simulation waveform of transient of the PWM comparator shown in FIG. 7.

FIG. 10 shows a simulation waveform of transient of the PWM comparator of FIG. 7. According to FIG. 10, a sinusoidal signal, with a common-mode voltage of 2.5V, an amplitude of 0.5V, and a frequency of 10 kHz, is applied at the $V_{sin}$ terminal, its; and a triangle signal, with a frequency of 250 kHz, and an amplitude of 2~3V, is applied at the $V_{osc}$ terminal. During the whole modulation process, the PWM comparator of FIG. 7 works stably even if the duty cycle is nearly 100%.

In addition, the present disclosure further provides a class D amplifier incorporating the PWM comparator as described above, the pre-circuit and after-circuit of the PWM comparator in the class D amplifier can be conventional, which will not be described in detail here.

In summary, by introducing two ways of current feedback, the PWM comparator of the present disclosure has a dynamic hysteresis. Under identical resolutions, the noise resistance ability of the present disclosure is much better than conventional fixed-hysteresis comparator, thus the PWM comparator can work stably even if the duty cycle of the output signal is nearly 100%.

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A PWM comparator comprising a preamplifier circuit, a feedback circuit and a judge circuit; wherein
    the preamplifier circuit comprises two input-terminals respectively for receiving a high frequency triangle signal and an input audio signal, and the preamplifier circuit outputs the changes of waveform of the high frequency triangle signal and the input audio signal to the feedback circuit and the judge circuit;
    the feedback circuit is connected to the preamplifier circuit and the judge circuit, the feedback circuit comprises an internal current source, the feedback circuit adjusts the current from the current source to the input of the judge circuit, according to the waveform changes of the high frequency triangle signal received from the pre amplified preamplifier circuit, and a voltage level of PWM signals of the PWM comparator;
    the judge circuit is connected to the feedback circuit, the judge circuit obtains the changes of the high frequency triangle signal and the input audio signal based on a change of a input current of the judge circuit, and generates a comparison result according to a comparison of the high frequency triangle signal and the input audio signal.

2. The PWM comparator according to claim 1, further comprises an output buffer circuit connected with the feedback circuit and the judge circuit for producing and outputting a PWM signal according to the comparison result.

3. The PWM comparator according to claim 2, wherein the preamplifier circuit comprises: a first input NMOSFET, a second input NMOSFET, a first mirror PMOSFET, and a second mirror PMOSFET; wherein
    the first input NMOSFET has a gate for receiving the input audio signal, a drain connected to a drain of the first mirror PMOSFET, and a source connected to a source of the second input NMOSFET;
    the second input NMOSFET has a gate for receiving the high frequency triangle signal, a drain to be connected to a drain of the second mirror PMOSFET;
    a first current source for being connected between ground and sources of the first input NMOSFET and the second input NMOSFET;
    the first mirror PMOSFET has a gate and a drain interconnected to each other, and a source connected to a power source;
    the second mirror PMOSFET has a gate and a drain interconnected to each other, and a source connected to the power source.

4. The PWM comparator according to claim 3, wherein the feedback circuit comprises: a second current source, a third current source, a first switch, and a second switch; wherein
    one terminal of the first switch is connected to the second current source, the other terminal is able to be connected to a first contact terminal or a second contact terminal based on the waveform of the high frequency triangle signal; wherein the first contact terminal is connected to the gate of the second mirror PMOSFET, the second contact terminal is connected to the gate of the first mirror PMOSFET;
    one terminal of the second switch is connected to the third current source, the other terminal is able to be connected to a third contact terminal or a fourth contact terminal based on the voltage level of the pulse width signal; wherein the gate of the second mirror PMOSFET is connected to the third contact terminal, the gate of the first mirror PMOSFET is connected to the fourth contact terminal.

5. The PWM comparator according to claim 4, wherein the first switch is switchably connected to the first contact terminal at a rising edge of the high frequency triangle signal, and switchably connected to the second contact terminal at the falling edge of the high frequency triangle signal; the second switch is switchably connected to the third contact terminal at the low level of the PWM signal, and switchably connected to the fourth contact terminal at the high level of the PWM signal.

6. The PWM comparator according to claim 4, wherein the judge circuit comprises: a third mirror PMOSFET, a fourth mirror PMOSFET, a first comparing NMOSFET, a second comparing NMOSFET, a third comparing NMOSFET, and a fourth comparing NMOSFET, wherein
    the third mirror PMOSFET has a source connected to the power source, a gate connected to a gate of the first mirror PMOSFET, and a drain connected to a drain of the first comparing NMOSFET;
    the fourth mirror PMOSFET has a source connected to the power source, a gate connected to a gate of the second mirror PMOSFET, and a drain connected to a drain of the fourth comparing NMOSFET;
    the drain and the gate of the first comparing NMOSFET are interconnected with each other, the source of the first comparing NMOSFET is connected to ground;
    the second comparing NMOSFET has a gate connected to the drain of the third comparing NMOSFET, a drain of the second comparing NMOSFET connected to the gate of the third comparing NMOSFET, the sources of the second comparing NMOSFET and the third comparing NMOSFET are connected to ground;
    the gate of the third comparing NMOSFET is connected to the drain of the third mirror PMOSFET, the drains of the third comparing NMOSFET and the fourth mirror PMOSFET are interconnected with each other;

the drain and gate of the fourth comparing NMOSFET are interconnected with each other, the source of the fourth comparing NMOSFET is connected to ground.

7. The PWM comparator according to claim 6, wherein the output buffer circuit has two input-terminals connected to the gate and the drain of the third comparing NMOSFET respectively, and one output-terminal for outputting the PWM signal.

8. The PWM comparator according to claim 1, wherein the preamplifier circuit and the judge circuit have a CMOS operational transconductance amplifier structure.

9. The PWM comparator according to claim 2, wherein the preamplifier circuit comprises: a first input NPN transistor, a second input NPN transistor, a first mirror PMOSFET, a second mirror PMOSFET, a first mirror NMOSFET, and a second mirror NMOSFET; wherein
the first input NPN transistor has a base for receiving the input audio signal, a collector connected to a drain of the first mirror PMOSFET, and an emitter connected to an emitter of the second input NPN transistor;
the second input NPN transistor has a base for receiving a high frequency triangle signal and a collector connected to the drain of the second mirror PMOSFET;
the emitters of the first input NPN transistor and the second input NPN transistor are connected to drain of the second mirror NMOSFET, the sources of the first mirror NMOSFET and the second mirror NMOSFET are connected to ground;
the first mirror PMOSFET has a gate and a drain interconnected with each other;
the second mirror PMOSFET has a gate and a drain interconnected with each other.

10. The PWM comparator according to claim 9, wherein the feedback circuit comprises: a first feedback NMOSFET, a second feedback NMOSFET, a third feedback NMOSFET, a fourth feedback NMOSFET, a third mirror NMOSFET, and a fourth mirror NMOSFET; wherein
the first feedback NMOSFET has a gate for receiving a external control signal, a drain connected to the gate of the second mirror PMOSFET, the sources of the first feedback NMOSFET and the second feedback NMOSFET are connected to a drain of the third mirror NMOSFET;
the second feedback NMOSFET has a gate for receiving a reference voltage, a drain connected to the gate of first mirror PMOSFET;
the third feedback NMOSFET has a gate for receiving the reference voltage, a drain connected to the gate of the second mirror PMOSFET, a source connected to the sources of the fourth feedback NMOSFET and drain of the fourth mirror NMOSFET;
the fourth feedback NMOSFET has a gate connected to the output-terminal of the output buffer circuit, a drain connected to the gate of the first mirror PMOSFET;
sources of the third mirror NMOSFET and the fourth mirror NMOSFET are connect to ground.

11. The PWM comparator according to claim 10, wherein the judge circuit comprises: a third mirror PMOSFET, a fourth mirror PMOSFET, a first comparing NMOSFET, a second comparing NMOSFET, a third comparing NMOSFET, a fourth comparing NMOSFET, a fifth mirror NMOSFET, a sixth mirror NMOSFET, a fifth mirror PMOSFET, and a sixth mirror PMOSFET; wherein
the third mirror PMOSFET has a gate connected to the gate of the first mirror PMOSFET, a drain connected to the drain of the first comparing NMOSFET;
the fourth mirror PMOSFET has a gate connected to the gate of the second mirror PMOSFET, a drain connected to a drain of the second comparing NMOSFET;
a gate and a drain of the first comparing NMOSFET are interconnected with each other, a source of the first comparing NMOSFET connects to ground;
sources of the third comparing NMOSFET and the fourth comparing NMOSFET connect to ground, a gate of the third comparing NMOSFET connects with a drain of the fourth comparing NMOSFET, a gate of the fourth comparing NMOSFET is connected to a drain of the third comparing NMOSFET, the gate of the fourth comparing NMOSFET is connected with the drain of the third mirror PMOSFET, the drains of the fourth comparing NMOSFET and the fourth mirror PMOSFET are connected together;
the drain and gate of the second comparing NMOSFET are interconnected with each other, source of the second comparing NMOSFET is connected to ground;
a source of the fifth mirror NMOSFET is connected to ground, drains of the fifth mirror NMOSFET and the sixth mirror PMOSFET are interconnected with each other;
a source of the sixth mirror NMOSFET is connected to ground, drains of the sixth mirror NMOSFET and the fifth mirror PMOSFET are interconnected with each other.

12. The PWM comparator according to claim 11, wherein the output buffer circuit comprises: a first inverter, a Schmitt trigger, and a second inverter connected in series successively; an input-terminal of the first inverter is connected to the drain of the sixth mirror PMOSFET; the second inverter outputs the PWM signal.

13. The PWM comparator according to claim 11, wherein the first mirror NMOSFET, the third mirror NMOSFET, and the fourth mirror NMOSFET have the same width to length ratio; the width to length ratio of the second mirror NMOSFET is four times as that of the first mirror NMOSFET; The first mirror PMOSFET, the second mirror PMOSFET, the third mirror PMOSFET, and the fourth mirror PMOSFET have the same width to length ratio, which is greater than that of the second mirror NMOSFET; the first comparing NMOSFET, the second comparing NMOSFET, the fifth mirror NMOSFET, and the sixth mirror NMOSFET $M_{14}$ have the same width to length ratio, which is greater than that of the first mirror NMOSFET and less than that of the second mirror NMOSFET; the third comparing NMOSFET and the fourth comparing NMOSFET have the same width to length ratio, which is greater than that of the first comparing NMOSFET and less than that of the second mirror NMOSFET; the fifth mirror PMOSFET has the same width to length ratio as that of the sixth mirror PMOSFET, which is greater than that of the first mirror PMOSFET; the first feedback NMOSFET to the fourth feedback NMOSFET have the same width to length ratio, which is less than that of the first mirror NMOSFET.

14. A class D amplifier comprising the PWM comparator according to claim 1.

* * * * *